United States Patent
Ray et al.

(10) Patent No.: US 10,483,086 B2
(45) Date of Patent: Nov. 19, 2019

(54) BEAM PROFILING SPEED ENHANCEMENT FOR SCANNED BEAM IMPLANTERS

(71) Applicant: Axcelis Technologies, Inc., Beverly, MA (US)

(72) Inventors: Andy M. Ray, Newburyport, MA (US); Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 350 days.

(21) Appl. No.: 14/978,120

(22) Filed: Dec. 22, 2015

(65) Prior Publication Data

US 2016/0189926 A1  Jun. 30, 2016

Related U.S. Application Data

(60) Provisional application No. 62/096,963, filed on Dec. 26, 2014.

(51) Int. Cl.
| | | |
|---|---|---|
| *H01J 37/30* | (2006.01) | |
| *H01J 37/304* | (2006.01) | |
| *H01J 37/317* | (2006.01) | |

(52) U.S. Cl.
CPC ........ *H01J 37/304* (2013.01); *H01J 37/3171* (2013.01); *H01J 2237/24514* (2013.01); *H01J 2237/24528* (2013.01); *H01J 2237/24535* (2013.01); *H01J 2237/24542* (2013.01); *H01J 2237/30483* (2013.01); *H01J 2237/31703* (2013.01)

(58) Field of Classification Search
CPC .. H01J 37/302; H01J 37/3023; H01J 37/3026; H01J 37/3002; H01J 37/3005; H01J 37/3174; H01J 2237/24514; H01J 2237/24528; H01J 2237/24542; H01J 2237/30483; H01J 2237/31703
See application file for complete search history.

(56) References Cited

U.S. PATENT DOCUMENTS 5,132,544 A * 7/1992 Glavish ................... G21K 1/093
                                                        250/398
6,297,510 B1 * 10/2001 Farley ..................... H01J 37/304
                                                        250/492.21

(Continued)

*Primary Examiner* — David E Smith
(74) *Attorney, Agent, or Firm* — Eschweiler & Potashnik, LLC

(57) ABSTRACT

An ion implantation system and method are provided where an ion beam is tuned to a first process recipe. The ion beam is scanned along a scan plane at a first frequency, defining a first scanned ion beam. A beam profiling apparatus is translated through the first scanned ion beam and one or more properties of the first scanned ion beam are measured across a width of the first scanned ion, thus defining a first beam profile associated with the first scanned ion beam. The ion beam is then scanned at a second frequency, thus defining a second scanned ion beam, wherein the second frequency is less than the first frequency. A second beam profile associated with the second scanned ion beam is determined based, at least in part, on the first beam profile. Ions are subsequently implanted into a workpiece via the second scanned ion beam.

17 Claims, 2 Drawing Sheets

(56) References Cited

U.S. PATENT DOCUMENTS

2002/0134948 A1* 9/2002 Olson .................... G21K 1/08
                                                      250/492.21
2005/0191409 A1* 9/2005 Murrell ............... H01J 37/3171
                                                          427/8

* cited by examiner

BEAM PROFILING SPEED ENHANCEMENT FOR SCANNED BEAM IMPLANTERS

REFERENCE TO RELATED APPLICATION

This application claims priority to and the benefit of U.S. Provisional Application Ser. No. 62/096,963 which was filed Dec. 26, 2014, entitled "BEAM PROFILING SPEED ENHANCEMENT FOR SCANNED BEAM IMPLANTERS", the entirety of which is hereby incorporated by reference as if fully set forth herein.

FIELD OF THE INVENTION

The present invention relates generally to ion implantation systems, and more specifically to dosimetry system method for expediently determining an ion beam current profile.

BACKGROUND OF THE INVENTION

In the manufacture of semiconductor devices, ion implantation is used to dope semiconductors with impurities. Ion implantation systems are often utilized to dope a workpiece, such as a semiconductor wafer, with ions from an ion beam, in order to either produce n- or p-type material doping, or to form passivation layers during fabrication of an integrated circuit. When used for doping semiconductor wafers, the ion implantation system injects a selected ion species into the workpiece to produce the desired extrinsic material.

It is often desirable to determine the amount of dopant being delivered to the workpiece in the ion implantation. The measurement of ions implanted in a wafer or workpiece is referred to as dosimetry. In ion implantation applications, dosimetry is typically performed by measuring electrical current (e.g., the ion beam current). In controlling the dosage of implanted ions, closed loop feedback control systems are commonly utilized to dynamically adjust the implantation in order to achieve dose uniformity in the implanted workpiece. Such control systems monitor a current of the ion beam in order to control a speed at which the workpiece is scanned through the ion beam, therein providing a uniform implantation of ions across the workpiece.

In ion implantation systems having a ribbon-shaped ion beam (e.g., an electrostatically scanned ion beam having a cross-sectional width greater its height), a profile, or shape, of the ion beam is often desired in order to properly tune the translation speed and path of the workpiece through the beam to achieve uniform doping. In such a circumstance, the Faraday cup is typically translated or scanned through the ion beam while the ion beam is electrostatically scanned at the same frequency as utilized during implantation into a workpiece. As such, a slit in the Faraday cup incrementally measures beam current associated with the ion beam and the Faraday cup will dwell at each spatial point long enough to integrate the current over a full beam profile.

Such a passing of the Faraday cup through the ion beam provides a time-dependent profile of the ion beam, and is typically considered to be an adequate approximation of the overall profile of the ion beam. However, since the time-dependent profile is typically performed using the same frequency of scanning of the ion beam utilized during actual implantation into a workpiece, and since more than one profile is often desired to reduce noise effects, excessively long profiling times are commonplace, and throughput is compromised.

SUMMARY OF THE INVENTION

The present disclosure presently provides a system and method for adequately and expeditiously profiling an ion beam by performing profiling operations at an ion beam scanning speed that is significantly greater than the speed utilized during actual implantation. Accordingly, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In scanned-beam ion implantation systems (e.g., a 2-dimensions scanned beam, or 1-dimensional scanned beam with 1-dimensional mechanical scan), dose uniformity correction, angle measurement and correction, and other "ribbon" beam measurements typically occur with an ion beam scanning at a scan frequency used for implantation into a workpiece. When the scan frequency is very low (e.g., approximately 1-2 Hz), in order to gain certain process advantages, measurement times can become very long (e.g., on the order of 1-2 minutes or more) because the measurement device needs to accumulate a sufficient number of scans.

For example, a dose uniformity measurement is typically made with a traveling slit faraday cup that moves across the "ribbon" beam profile. The cup needs to dwell at each spatial point long enough to integrate the current over a full beam profile. Typically, around 300 spatial points are measured and integrated over at least several full profiles in order to reduce noise. Even with a pair of profiles, at 1 Hz such an exercise would take approximately 300 seconds (e.g., 300*1 full cycle (2 passes of the beam over the cup)*1 sec/cycle=300 seconds). Since at least two profiling passes are typically performed, this can result in unacceptably long measurement times, thus producing a large throughput decrease compared to higher scan frequencies. Thus, the present disclosure describes apparatuses and methods to reduce the measurement time associated with a slow beam scan.

The present disclosure presently appreciates that an instantaneous beam profile shape is not a strong function of the scan frequency in the range of interest (e.g., 1-1000 Hz). Thus, the present disclosure can advantageously provide beam measurements to be made at high frequency, thus reducing the time taken for the measurements. Once the measurements are complete, the scan frequency can be reduced to the low frequency required for implant. If desired, a final check can be made at the implant frequency.

Accordingly, a method for implanting ions is provided, wherein the ion beam is tuned to a desired current. Such ion beam tuning, for example, can be performed with scanning of the beam turned off, or with scanning turned on and at either the implant scan frequency or a different frequency. Scanning is then tuned to a different frequency than utilized for implantation, such that the new frequency is optimized for faster measurement times. For example, the frequency used for measurements is significantly higher than that used for implantation. Ion beam measurements are further performed, such as dose uniformity measurements and beam angle measurements. The scan frequency is then changed to the implant scan frequency. If desired, a final check of beam measurements can be performed at the implant scan frequency.

If variations are found between the measurements at two different frequencies, then it may be possible to apply corrections based on the difference in frequency between the two measurement sets. For example, if the beam angles increase at the edges at low frequency, then the measurement at high frequency can be corrected to account for this. The corrections, for example, can be stored recipe by recipe, (e.g., similar to an autotune history).

Further, another method utilizing such corrections is provided, wherein the ion beam is tuned to the desired current. Such beam tuning can be done with scanning off, or with scanning on and at either the implant scan frequency or a different frequency. Scanning is turned on to a different frequency than utilized for implant, such that the new frequency is optimized for faster measurement times. The frequency used for measurements, for example, can be significantly higher than that used for implant. Beam measurements are further performed, such as dose uniformity measurements and beam angle measurements.

The scan frequency is then switched to the implant scan frequency, and corrections to the measurements and scan waveform can be applied. If desired, a final check of beam measurements at the implant scan frequency can also be performed.

One possible cause of the variation between the measurements at two frequencies is a difference in the frequency response of the scan generation or amplification systems. In this case, it may be advantageous to match the waveforms of the two frequencies in some manner that is faster than comparing beam profiler passes. As an example, a high bandwidth independent measurement of the electric or magnetic field could be used to measure the actual waveform at each frequency and the scan waveform would then be modified at the slow scan frequency until it precisely matches the shape of the waveform at the higher frequency scan. In one example, it may also be sufficient to use a theoretical model of the frequency response error to adjust the waveform rather than a direct measurement. In either case the present disclosure can reduce the number of iterations of the profile measurements and reduce the overall correction time.

The present invention is directed generally toward an ion implantation system and method for expeditiously determining a profile of an ion beam. In accordance with one exemplary aspect, the ion implantation system comprises an ion source configured to generate an ion beam having an ion beam current associated therewith. The ion beam, for example, comprises a scanned pencil beam or a ribbon beam. A mass analyzer if further provided and configured to mass analyze the ion beam.

According to one example, a beam scanner is provided and configured to scan the ion beam along a scan plane, therein defining a scanned ion beam. The beam scanner, for example, is further configured to scan the ion beam at a first frequency and a second frequency, wherein the first frequency is greater than the second frequency. In one example, the first frequency is an order of magnitude greater than the second frequency, wherein the first frequency is utilized for profiling the ion beam, and the second frequency is utilized for implantation of ions into a workpiece. An end station is configured to receive the scanned ion beam at a workpiece plane associated with the workpiece, such as when the beam scanner scans the ion beam at the second frequency;

In one aspect, a beam profiling apparatus is configured to translate through the scanned ion beam along the scan plane at least when the ion beam is scanned at the first frequency. The beam profiling apparatus, for example, is further configured to measure one or more properties of the scanned ion beam, such as a current and angular orientation of the scanned ion beam, wherein the measurement occurs concurrent with the translation of the beam profiling apparatus.

A controller is further configured determine a profile of the scanned ion beam when the ion beam is scanned at the second frequency, wherein the determination is based, at least in part, on the one or more properties of the scanned ion beam when the ion beam is scanned at the first frequency. In another example, the controller is further configured to tune the ion beam based on the one or more properties of the ion beam that are measured at the first frequency and a desired one or more properties of the ion beam when the ion beam is scanned at the second frequency. The controller, for example, is configured to tune the ion beam via a control of one or more of the ion source, the mass analyzer, and the beam scanner.

A method for implanting ions is provided in accordance with another aspect of the disclosure, wherein an ion beam is tuned to a first process recipe. The ion beam is scanned along a scan plane at a first frequency, therein defining a first scanned ion beam, and a beam profiling apparatus is translated through the first scanned ion beam. One or more properties of the first scanned ion beam are measured across a width of the first scanned ion beam concurrent with the translation of the beam profiling apparatus, therein defining a first beam profile associated with the first scanned ion beam. The first beam profile, for example, comprises a time and position dependent profile of the ion beam at the first scan frequency.

The ion beam is further configured to be scanned along the scan plane at a second frequency for implantation into a workpiece, therein defining a second scanned ion beam, wherein the second frequency is less than the first frequency. A second beam profile associated with the second scanned ion beam is thus determined based, at least in part, on the first beam profile. For example, the second beam profile comprises a time and position dependent profile of the ion beam at the second scan frequency, wherein, again, the second beam profile is based on the first beam profile. In one example, the ion beam is further tuned to a second process recipe, wherein the second process recipe is based on the second profile. In another example, the determination of the second profile is further based on a frequency response of scan generation and amplification systems associated with the scanning of the ion beam.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
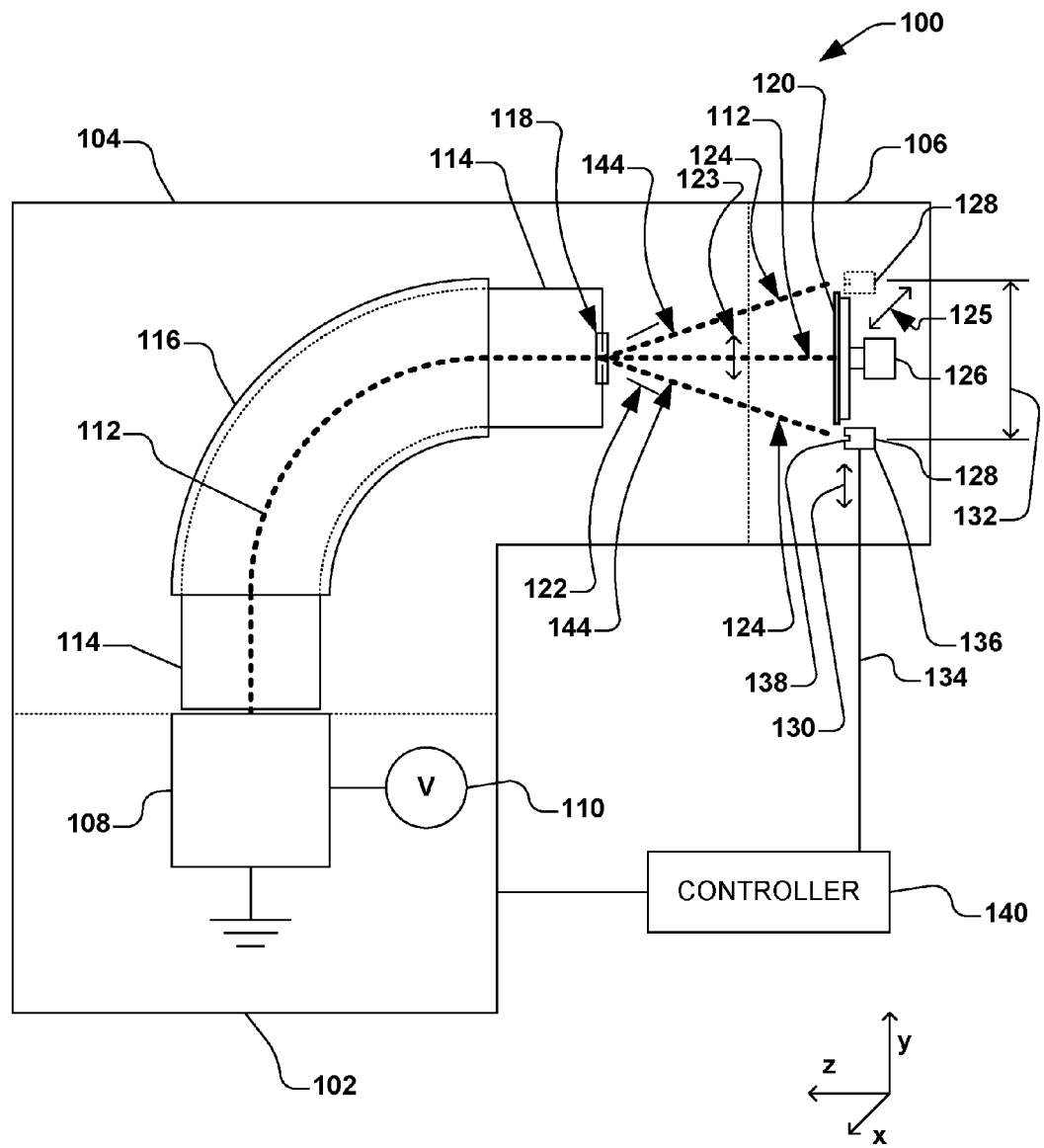
FIG. 1 illustrates a block diagram of an ion implantation system according to one exemplary aspect of the present disclosure.

The present invention is directed generally toward a system, apparatus, and method for expeditiously determining a profile of a scanned ion beam. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates an exemplary ion implantation system 100 having a terminal 102, a beamline assembly 104, and an end station 106. The terminal 102, for example, comprises an ion source 108 powered by a high voltage power supply 110, wherein the ion source produces and directs an ion beam 112 through the beamline assembly 104, and ultimately, to the end station 106. The ion beam 112, for example, can take the form of a spot beam, pencil beam, ribbon beam, or any other shaped beam. The beamline assembly 104 further has a beamguide 114 and a mass analyzer 116, wherein a dipole magnetic field is established to pass only ions of appropriate charge-to-mass ratio through an aperture 118 at an exit end of the beamguide 114 to a workpiece 120 (e.g., a semiconductor wafer, display panel, etc.) positioned in the end station 106.

In accordance with one example, an ion beam scanning mechanism 122, such as an electrostatic or electromagnetic scanner (referred to generically as a "scanner"), is configured to scan the ion beam 112 in at least a first direction 123 (e.g., the +/−y-direction, also called a first scan path or "fast scan" axis, path, or direction) with respect to the workpiece 120, therein defining a ribbon-shaped ion beam 124 or scanned ion beam. Furthermore, in the present example, a workpiece scanning mechanism 126 is provided, wherein the workpiece scanning mechanism is configured to selectively scan the workpiece 120 through the ion beam 112 in at least a second direction 125 (e.g., the +/−x-direction, also called a second scan path or "slow scan" axis, path, or direction). The ion beam scanning system 122 and the workpiece scanning system 126, for example, can be instituted separately, or in conjunction with one another, in order to provide the desired scanning of the workpiece relative to the ion beam 112.

In another example, the ion beam 112 is electrostatically scanned in the first direction 123, therein producing the scanned ion beam 124, and the workpiece 120 is mechanically scanned in the second direction 125 through the scanned ion beam 124. Such a combination of electrostatic and mechanical scanning of the ion beam 112 and workpiece 120 produces what is called a "hybrid scan". The present invention is applicable to all combinations of scanning of the workpiece 120 relative to the ion beam 112, or vice versa.

According to another example, a beam profiling apparatus 128 is provided along the path of the ion beam 112 in order to measure one or more properties (e.g., ion beam current) of the ion beam. The beam profiling apparatus 128 can be provided upstream or downstream of the workpiece 120, wherein the beam profiling apparatus is configured to sense the one or more properties of the ion beam 112 (e.g., the ion beam current) when the ion beam does not intersect the workpiece. The beam profiling apparatus 128, for example, is configured to translate through the ion beam along a profiling plane 130 (e.g., in the first direction 123) in a predetermined time, wherein the beam profiling apparatus is further configured to measure the beam current across a width 132 of the ion beam 112 concurrent with the translation, therein defining a time and position dependent beam current profile 134 (also called a time-dependent profile or time-dependent measurement) of the ion beam.

The beam profiling apparatus 128, for example, comprises a Faraday cup 136, wherein the Faraday cup in one example comprises a narrow slit 138 directed upstream (e.g., facing the ion beam 112), and is configured to be traversed along the first direction 123 across the entire width of ion beam in order to attain the profile of the ion beam. Accordingly, the Faraday cup 136 is thus configured to provide time and position dependent beam current profile 134 to a controller 140. The controller 140, for example, is configured to control and/or send and receive signals to at least one or more of the ion source 108, high voltage power supply 110, beamguide 114, mass analyzer 116, ion beam scanning mechanism 122, workpiece scanning mechanism 126, and the beam profiling apparatus 128. In particular, the controller 140 is configured to control a frequency of scanning the ion beam 112, as will be discussed in further detail, infra.

Figure 2:
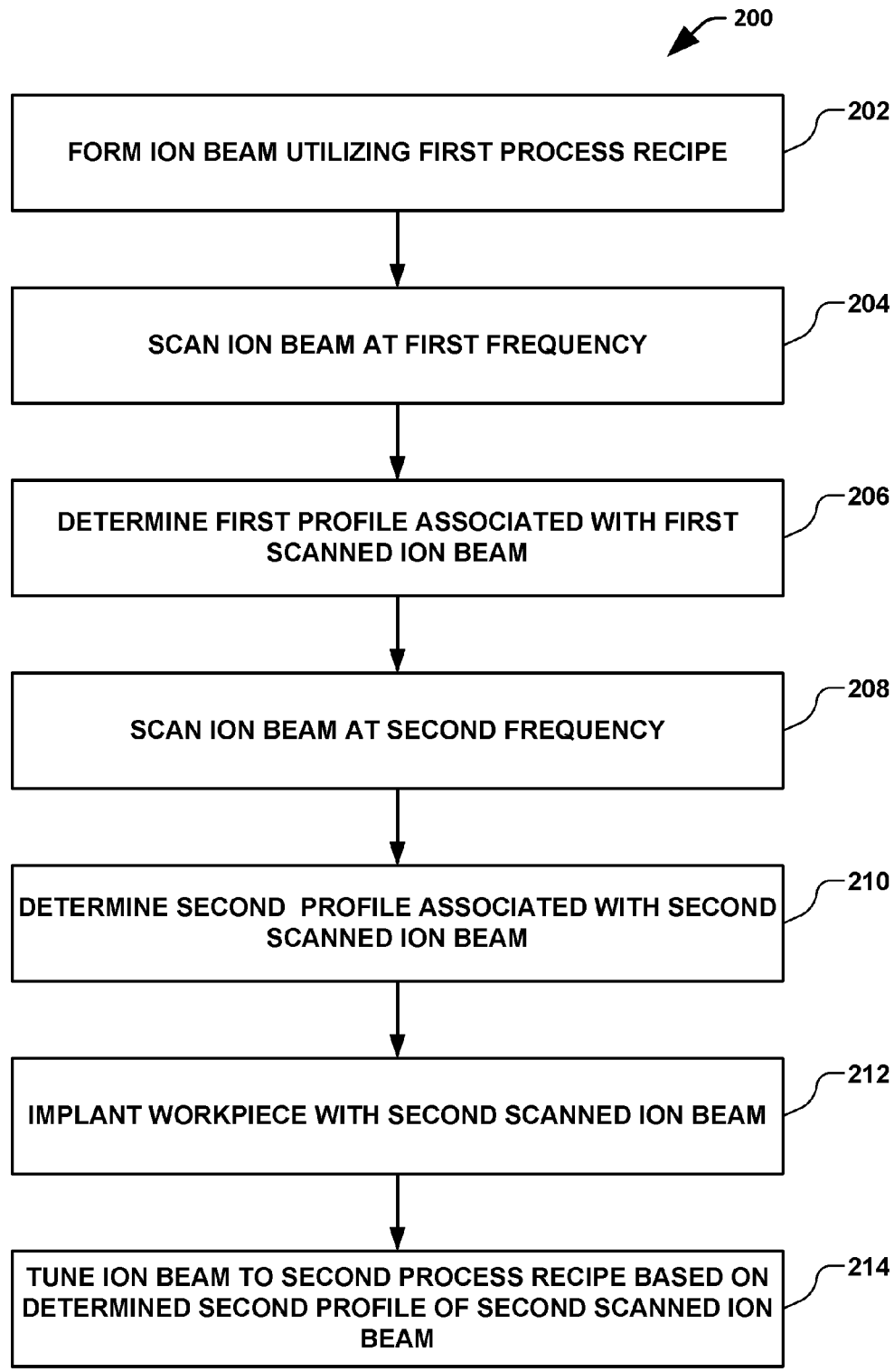
FIG. 2 is a block diagram illustrating an exemplary method for profiling an ion beam in accordance with the present disclosure.

In accordance with another aspect of the present invention, FIG. 2 illustrates an exemplary method 200 for expeditiously determining a profile of an ion beam. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 2, the method 200 begins with act 202, wherein an ion beam is formed utilizing a first process recipe. The first process recipe, for example, comprises various settings for processing a workpiece. In act 204, the ion beam is scanned at a first frequency along a scan plane to form a first scanned ion beam. For example, the ion beam 112 of FIG. 1 is electrostatically scanned via the ion beam scanning system 122 at the first frequency, thus defining the first scanned ion beam of act 204 of FIG. 2. In act 206, one or more properties of the first scanned ion beam are measured by translating a beam profiling apparatus through the ion beam. Accordingly, in one example, a time and position dependent first profile associated with the first scanned ion beam is defined.

The one or more properties of the first scanned ion beam, for example, are measured across a width of the first scanned ion beam concurrent with the translation of the beam profiling apparatus, therein defining the first beam profile associated with the first scanned ion beam. The one or more properties of the first scanned ion beam, for example, comprise one or more of a current, uniformity, and angle of the ion beam incident to a plane of the workpiece.

In act 208, the ion beam is scanned at a second frequency along the scan plane to form a second scanned ion beam. In the present example, the second frequency is less than the first frequency. In one example, the first frequency is an order of magnitude greater than the second frequency. In another example, the first frequency is at least twice the second frequency.

A time and position dependent second profile associated with the second scanned ion beam is determined in act 210, wherein the determination is based, at least in part, on the first profile. Accordingly, in act 212, ions are implanted into a workpiece via the second scanned ion beam that is scanned at the second frequency. As such, the ion beam 112 of FIG. 1, for example, is profiled when the ion beam is scanned at a frequency that is substantially higher than the frequency of scanning utilized during implantations. Accordingly, throughput is increased by decreasing the time taken for profiling of the ion beam.

In accordance with another example, the ion beam is further tuned to a second process recipe in act 214 of FIG. 2, wherein the second process recipe is based, at least in part, on the second profile. For example, variations between the first frequency and second frequency of scanning can be compensated for by tuning the ion beam to the second process recipe. Furthermore, the determination of the second profile can be further based on a frequency response of scan generation and amplification systems associated with the scanning of the ion beam.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An ion implantation system for implanting ions into a workpiece, comprising:
   an ion source configured to generate an ion beam;
   a mass analyzer configured to mass analyze the ion beam;
   a beam scanner configured to scan the ion beam along a scan plane, therein defining a scanned ion beam, wherein the beam scanner is further configured to scan the ion beam at a first frequency and a second frequency, wherein the first frequency is greater than the second frequency;
   an end station configured to receive the scanned ion beam at a workpiece plane associated with the workpiece when the beam scanner scans the ion beam at the second frequency;
   a beam profiling apparatus configured to translate through the scanned ion beam along the scan plane when the ion beam is scanned at the first frequency, wherein the beam profiling apparatus is further configured to measure one or more properties of the scanned ion beam concurrent with the translation; and
   a controller configured determine a profile of the scanned ion beam when the ion beam is scanned at the second frequency based, at least in part, on the one or more properties of the scanned ion beam when the ion beam is scanned at the first frequency, wherein the first frequency is at least twice the second frequency.

2. The ion implantation system of claim 1, wherein the one or more properties of the ion beam comprise one or more of a current of the ion beam and an angle of the ion beam incident to the workpiece plane.

3. The ion implantation system of claim 1, wherein the beam profiling apparatus comprises a Faraday cup configured to pass through the ion beam along the scan plane.

4. The ion implantation system of claim 3, wherein the Faraday cup comprises a narrow slit through which a portion of the ion beam is permitted to enter.

5. The ion implantation system of claim 1, wherein the controller is further configured to tune the ion beam based on the one or more properties of the ion beam that are measured at the first frequency and a desired one or more properties of the ion beam when the ion beam is scanned at the second frequency.

6. The ion implantation system of claim 5, wherein the controller is configured to tune the ion beam via a control of one or more of the ion source, the mass analyzer, and the beam scanner.

7. An ion implantation system for implanting ions into a workpiece, comprising:
   an ion source configured to generate an ion beam;
   a mass analyzer configured to mass analyze the ion beam;
   a beam scanner configured to scan the ion beam along a scan plane, therein defining a scanned ion beam, wherein the beam scanner is further configured to scan the ion beam at a first frequency and a second frequency, wherein the first frequency is greater than the second frequency;
   an end station configured to receive the scanned ion beam at a workpiece plane associated with the workpiece when the beam scanner scans the ion beam at the second frequency;
   a beam profiling apparatus configured to translate through the scanned ion beam along the scan plane when the ion beam is scanned at the first frequency, wherein the beam profiling apparatus is further configured to measure one or more properties of the scanned ion beam concurrent with the translation; and
   a controller configured determine a profile of the scanned ion beam when the ion beam is scanned at the second frequency based, at least in part, on the one or more properties of the scanned ion beam when the ion beam is scanned at the first frequency, wherein the first frequency is at least one order of magnitude greater than the second frequency.

8. A method for implanting ions, the method comprising:
   tuning an ion beam to a first process recipe;
   scanning the ion beam along a scan plane at a first frequency, therein defining a first scanned ion beam;
   translating a beam profiling apparatus through the first scanned ion beam;
   measuring one or more properties of the first scanned ion beam across a width of the first scanned ion beam concurrent with the translation of the beam profiling apparatus, therein defining a first beam profile associated with the first scanned ion beam; and
   scanning the ion beam along the scan plane at a second frequency, therein defining a second scanned ion beam, wherein the first frequency is at least twice the second frequency;

determining a second beam profile associated with the second scanned ion beam based, at least in part, on the first beam profile; and implanting ions into a workpiece via the second scanned ion beam.

9. The method of claim 8, further comprising tuning the ion beam to a second process recipe, wherein the second process recipe is based on the second profile.

10. The method of claim 8, wherein the one or more properties of the first scanned ion beam comprise one or more of a current, uniformity, and angle of the ion beam.

11. The method of claim 8, wherein the beam profiling apparatus comprises a Faraday cup.

12. The method of claim 8, wherein determining the second profile is further based on a frequency response of scan generation and amplification systems associated with the scanning of the ion beam.

13. A method for implanting ions, the method comprising:
tuning an ion beam to a first process recipe;
scanning the ion beam along a scan plane at a first frequency, therein defining a first scanned ion beam;
translating a beam profiling apparatus through the first scanned ion beam;
measuring one or more properties of the first scanned ion beam across a width of the first scanned ion beam concurrent with the translation of the beam profiling apparatus, therein defining a first beam profile associated with the first scanned ion beam; and
scanning the ion beam along the scan plane at a second frequency, therein defining a second scanned ion beam, wherein the first frequency is at least one order of magnitude greater than the second frequency;
determining a second beam profile associated with the second scanned ion beam based, at least in part, on the first beam profile; and
implanting ions into a workpiece via the second scanned ion beam.

14. A method of performing dosimetry control in an ion implantation system, comprising:
forming an ion beam utilizing a first process recipe;
scanning the ion beam at a first frequency along a scan plane to form a first scanned ion beam;
measuring one or more properties of the first scanned ion beam by translating a beam profiling apparatus through the ion beam, therein defining a time and position dependent first profile associated with the first scanned ion beam;
scanning the ion beam at a second frequency along the scan plane to form a second scanned ion beam, wherein the first frequency is at least one order of magnitude greater than the second frequency;
determining a time and position dependent second profile associated with the second scanned ion beam based, at least in part, on the first profile; and
implanting ions into a workpiece via the second scanned ion beam.

15. The method of claim 14, wherein measuring the one or more properties of the ion beam comprises measuring the ion beam current and angle of incidence of the ion beam at the scan plane.

16. The method of claim 14, wherein measuring the one or more properties of the ion beam comprises translating a Faraday cup from a first lateral edge to a second lateral edge of the first scanned ion beam and measuring the beam current via the Faraday cup.

17. The method of claim 14, further comprising tuning the ion beam to a second process recipe, wherein the second process recipe is based on the second profile.

* * * * *